US006541970B1

United States Patent
Takizawa et al.

(10) Patent No.: US 6,541,970 B1
(45) Date of Patent: *Apr. 1, 2003

(54) NUCLEAR MAGNETIC RESONANCE IMAGING METHOD AND DEVICE

(75) Inventors: Masahiro Takizawa, Kashiwa (JP); Tetsuhiko Takahashi, Soka (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/529,352
(22) PCT Filed: Oct. 15, 1998
(86) PCT No.: PCT/JP98/04655
§ 371 (c)(1), (2), (4) Date: Jun. 13, 2000
(87) PCT Pub. No.: WO99/20176
PCT Pub. Date: Apr. 29, 1999

(30) Foreign Application Priority Data

Oct. 17, 1997 (JP) .............................. 9-284944

(51) Int. Cl.$^7$ ................................. G01V 3/00
(52) U.S. Cl. .................. 324/309; 324/318; 600/410
(58) Field of Search .................. 324/309, 307, 324/318, 322; 600/410

(56) References Cited

U.S. PATENT DOCUMENTS 5,581,184 A    12/1996  Heid ........................ 324/309
6,118,273 A *  9/2000   Takizawa et al. ........... 324/309
6,275,038 B1 * 8/2001   Harvey ....................... 324/309

FOREIGN PATENT DOCUMENTS

DE   44 45 782     7/1996
JP   8-215170      8/1996
JP   8-215174      8/1996
JP   8-266505      10/1996

OTHER PUBLICATIONS

S. Kim et al., *Fast Interleaved Echo–Planar Imaging with Navigator: High Resolution Anatomic and Functional Images at 4 Tesla,* Magnetic Resonance in Medicine 35, 1996, pp. 895–902.

R. Ehman et al., *Adaptive Technique for High–Definition MR Imaging of Moving Structures,* Radiology 1989, vol. 173, No. 1, pp. 255–263.

* cited by examiner

Primary Examiner—Edward Lefkowitz
Assistant Examiner—Tiffany A. Fetzner
(74) Attorney, Agent, or Firm—Oliff & Berridge, PLC

(57) ABSTRACT

In a multi-shot MR imaging method, a navigator echo V(kx, n) of which phase-encoding amount is 0 is generated by applying a gradient magnetic field pulse in a readout direction (x-direction) and collected at each segment. A phase shift map C(kx, n) of V(kx, n) collected in the n-th segment is produced in k-space as a function in kx-direction with V(kx, 1) collected in the first segment being the reference. Next, noises are removed from C(kx, n), and C(kx, n) is smoothed. Then, an image echo signal S(kx, n, m) collected in the n-th segment is corrected in k-space according to a smoothed phase shift map C'(kx, n) of V(kx, n) collected in the same segment, and an image echo signal S'(kx, n, m) of which phase shifts are corrected is thereby acquired. Thus, the phase shifts of the image echo signals caused by a motion in the x-direction of a patient can be precisely corrected at a high speed. By reconstructing an image with the corrected image echo signal S'(kx, n, m), the image without motion artifacts can be acquired in realtime.

17 Claims, 6 Drawing Sheets

NUCLEAR MAGNETIC RESONANCE IMAGING METHOD AND DEVICE

FIELD OF THE INVENTION

The present invention relates generally to a nuclear magnetic resonance (MR) imaging method and apparatus that picks up nuclear magnetic resonance signals from hydrogen and phosphorus in a patient and transforms the distribution of density of nuclei and the distribution of relaxation time of nuclear spins into images, more particularly to MR imaging method and apparatus that reduce motion artifacts.

BACKGROUND OF THE INVENTION

When a patient moves during MR image acquisition, great artifacts occur on a reconstructed image. The artifacts are called motion artifacts, and occur because a phase of a collected echo signal is shifted by the patient motion and echo signals including the echo signal with the phase shift is Fourier transformed in a phase-encoding (or slice-encoding) direction. Thus, when the patient moves even a few millimeters, the whole image blurs in the encoding direction and it is a great impediment to the clinical diagnosis as a result.

To reduce the artifacts, a method in which navigator echoes are used has been introduced (S.-G. Kim et al., "Fast Interleaved Echo-Planar Imaging with Navigator: High Resolution Anatomic and Functional Images at 4 Tesla", Magnetic Resonance in Medicine 35, 1996, pp. 895–902). In this method, in the sequence shown in FIG. 6, a gradient magnetic field pulse that generates a navigator echo is applied between the application of a radiofrequency (RF) pulse 201 and a routine 211, and the navigator echo is thereby generated and collected. Each time the RF pulse 201 is applied, at least one navigator echo is collected. Then, the navigator echo collected within a certain repetition time 209 is a reference, and the patient motion is presumed from the difference between the reference navigator echo and the navigator echoes collected within a repetition time other than the certain repetition time 209. The phase shifts of echo signals (image echo signals) used for image reconstruction are corrected on the basis of the presumed patient motion. At this time, the patient motion is slow and a repetition time 210 is short, and thus the patient is regarded as motionless within one repetition time 210.

The following methods are known in which the phase shifts of the image echo signals are corrected with the navigation echoes: in a method (a), each navigator echo is Fourier transformed to find the phase shift from a correlation, and the image echo signals are corrected according to the phase shift; and in a method (b), each navigator echo is Fourier transformed to find a difference in phase between the navigator echoes, and a phase shift of data in hybrid space acquired by Fourier transforming the image echo signals is corrected in real space according to the phase shift of the corresponding navigator echo (R. L. Ehman et al., "Adaptive Technique for High-Definition MR Imaging of Moving Structures", Radiology 173, 1989, pp. 255–263).

However, in the method (a), a long calculation time is needed for Fourier transformation, and the precision is low since the phase shift of the navigator echo is found from the correlation. In the method (b), effects of only small patient motions that are some times as large as 0.1 pixel can be corrected.

When the MR imaging is applied to IVR (Interventional Radiology) in which a technique such as biopsy or catheter insertion is performed simultaneously with the imaging, it is required to correct effects of a patient motion of 5 mm or so in realtime. However, it can not be realized in the conventional methods described above.

The present invention has as its object the provision of MR imaging method and apparatus that can acquire images without motion artifacts by correcting phase shifts of image echo signals that are caused by a patient motion of more than some pixels in realtime.

SUMMARY OF THE INVENTION

To achieve the above-mentioned object, according to the present invention, in an MR imaging method such as multi-shot EPI method and 3D-EPI method where a segment in which at least one image echo signal is generated each time one RF pulse is applied is repeated to acquire data required for reconstruction of one image; at least one navigator echo is generated each time the RF pulse is applied. Then, a phase shift of each navigator echo is found in k-space with one of the navigator echoes being a reference, and phase shifts of M image echo signals are corrected in k-space according to the phase shifts of corresponding navigator echoes.

An MR imaging method according to the present invention is a characterized in that: in the MR imaging method for acquiring image data required for reconstruction of an image by repeating a plurality of times a segment in which an RF pulse and gradient magnetic fields in three directions that are perpendicular to each other are applied to a patient to time-sequentially generate and collect image echo signals, the MR imaging method comprises the steps of: (a) generating and collecting at least one navigator echo in each of the plurality of segments; (b) producing in k-space a phase shift map of each navigator echo collected in each of the plurality of segments with the navigator echo collected in a certain segment among the plurality of segments being a reference; and (c) correcting in k-space a phase of the image echo signals collected in each of the plurality of segments according to each phase shift map of each navigator echo collected in each of the plurality of segments.

An MR imaging method according to the present invention is characterized in that: the MR imaging method imaging method comprises the steps of: (a) applying a gradient magnetic field in a slicing direction to a patient to select a slice substantially at the same time as applying an RF pulse; (b) applying a gradient magnetic field pulse in α-direction that is one of the slicing direction, a phase-encoding direction and a readout direction to generate and collect a navigator echo; (c) applying a phase-encoding gradient magnetic field pulse which gives an offset for a phase-encoding and a readout gradient magnetic field pulse which gives an offset in the readout direction; (d) applying readout gradient magnetic field pulses of successively alternating polarity and applying phase-encoding gradient magnetic field pulses in synchronization with the readout gradient magnetic field pulses to time-sequentially generate and collect image echo signals within each cycle of the alternating readout gradient magnetic field pulses; (e) repeating a plurality of times a segment comprising the steps (a)–(d); (f) producing, in k-space as a function in the α-direction, a phase shift map of each navigator echo collected in each of the plurality of segments with the navigator echo collected in a certain segment among the plurality of segments being a reference; (g) correcting in k-space a phase at each time phase of the image echo signals collected in each of the plurality of segments according to each phase shift map of each navigator echo collected in each of the plurality of segments; and (h) reconstructing an image from the corrected image echo signals.

Preferably, a phase of each phase shift map may be fitted with a function in the step (f), or a phase of each phase shift map may be filtered in the step (f).

According to the MR imaging method of the present invention, the phase difference between the navigator echoes is found in k-space as a function in the α-direction (for example kx-direction), and hence Fourier transformation and correlation processing are not needed. Therefore, the phase shifts of the image echo signals caused by the patient motion can be precisely corrected at a high speed. Thus, the motion artifacts can be removed almost perfectly.

THE PREFERRED EMBODIMENT OF THE PRESENT INVENTION

The preferred embodiment of MR imaging method and apparatus of the present invention will be described hereunder according to the accompanying drawings.

Figure 1:
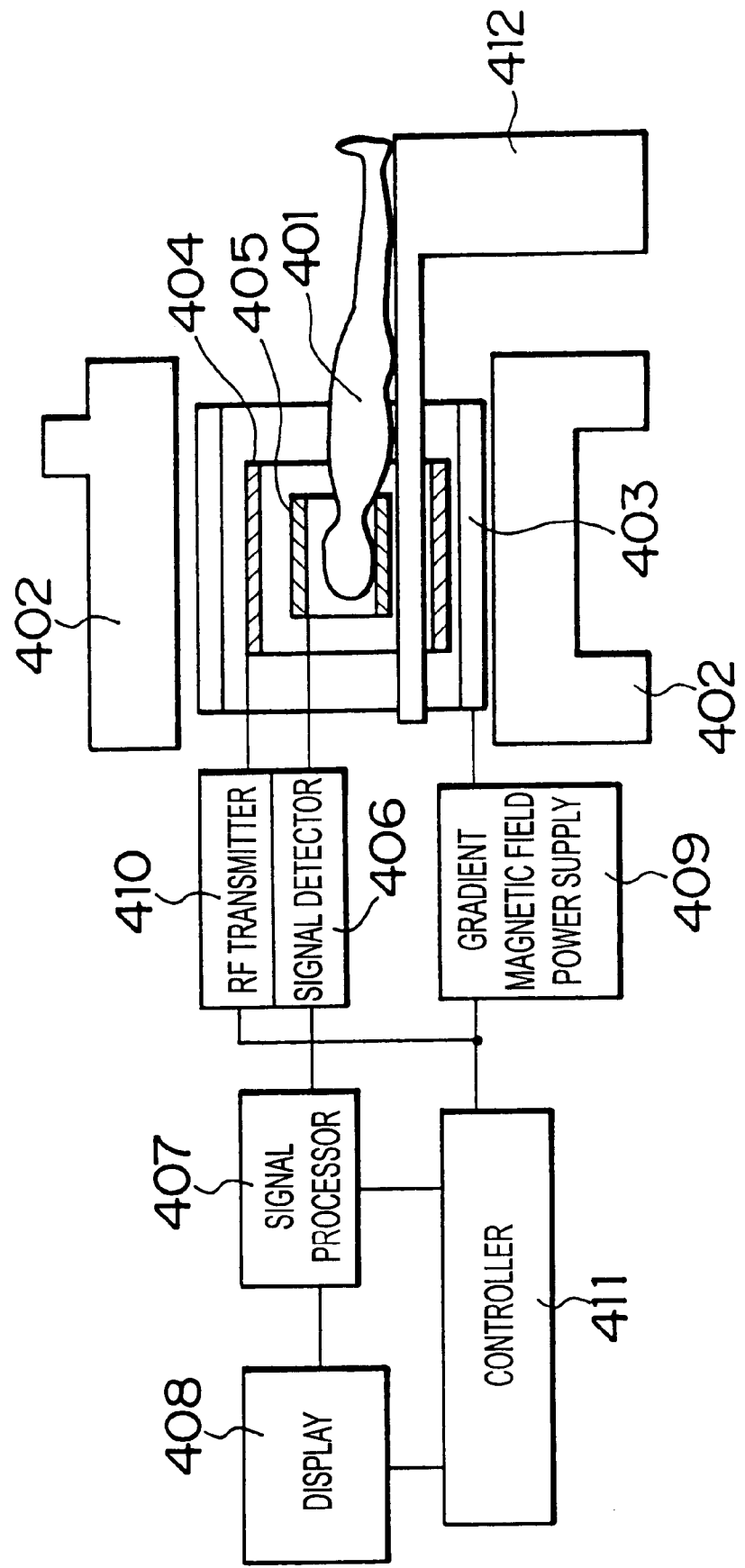
FIG. 1 is a view showing the entire structure of the MR imaging apparatus in an embodiment of the present invention.

FIG. 1 is a schematic view showing the entire structure of the MR imaging apparatus in an embodiment of the present invention. The MR imaging apparatus comprises: a magnet 402 for generating a static magnetic field in the space where a patient 401 is laid; gradient magnetic field coils 403 for generating gradient magnetic fields in the space; an RF coil 404 for generating a radio frequency magnetic field in the space; and an RF probe 405 for receiving an MR signal generated from the patient 401. The patient 401 is lying down on a bed 412.

The gradient magnetic field coils 403 are composed of three gradient magnetic field coils along x, y and z-axes perpendicular to each other, and the three gradient magnetic field coils apply gradient magnetic fields in a slice direction, a phase-encoding direction and a readout direction, respectively, in the space where the patient 401 is laid according to signals from a gradient magnetic field power supply 409. The axes of the applied gradient magnetic fields do not necessarily coincide with x, y and z-axes of the gradient magnetic field coils.

The RF coil 404 generates RF pulses in accordance with signals from an RF transmitting part 410. The MR signal received by the RF probe 405 is detected by a signal detector 406 and processed and converted by calculation into an image signal by a signal processing part 407. The image is displayed on a displaying part 408. The gradient magnetic field power supply 409, the RF transmitting part 410 and the signal detector 406 are controlled by a controlling part 411. The time chart of this control is generally called a pulse sequence.

Figure 2:
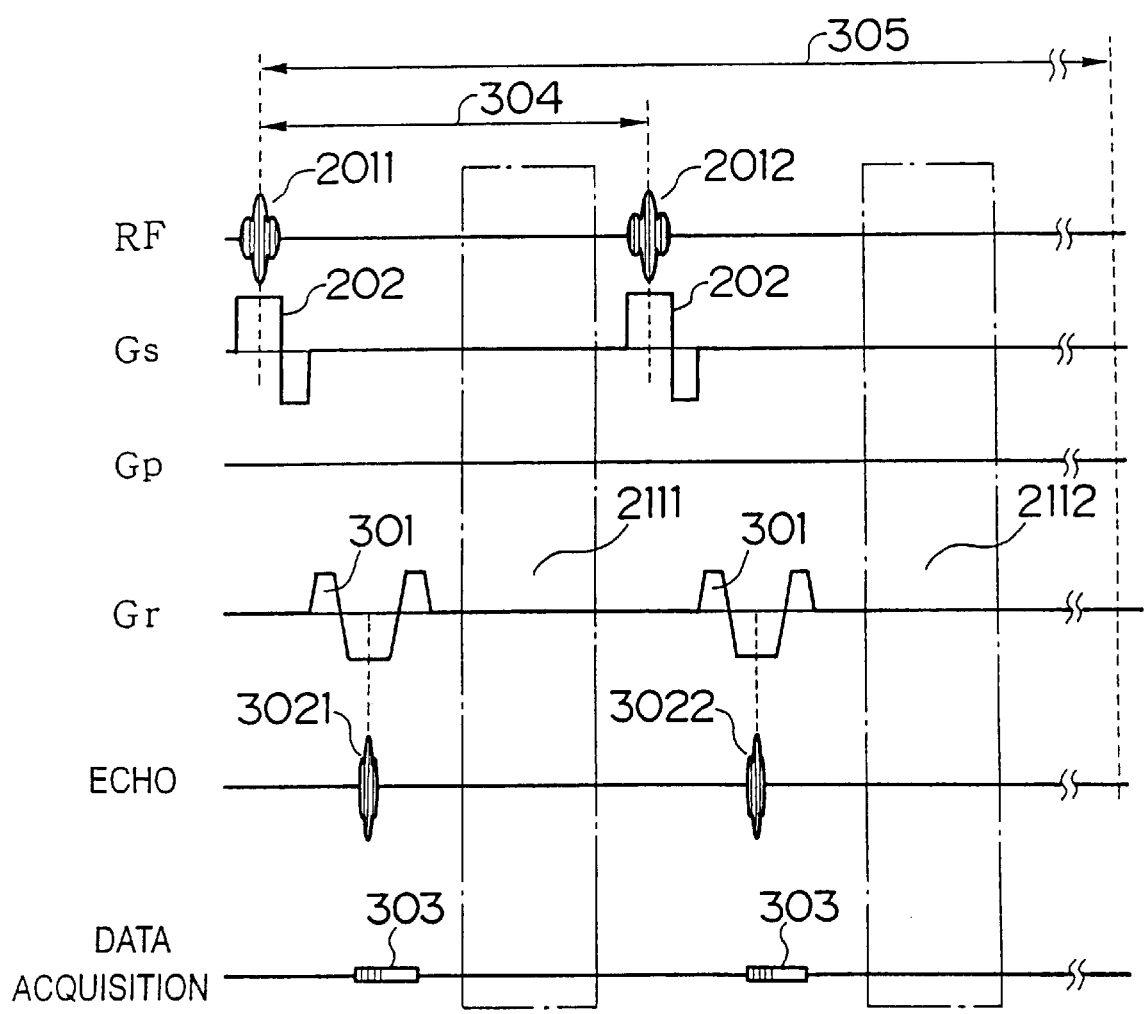
FIG. 2 is a view showing a sequence of conventional multi-shot EPI.

FIG. 2 shows an embodiment of the pulse sequence that the present invention adopts in the MR imaging apparatus. The pulse sequence is gotten by adding routines for generating navigator echoes to conventional multi-shot EPI sequence in FIG. 6 for a time 305. First, an RF pulse 2011 for exciting the nuclei to be detected and a slice selective gradient magnetic field pulse 202 for selecting a slice are applied to the patient substantially at the same time. Then, the gradient magnetic field 301 in the readout direction for generating a navigator echo is applied. When the positive application amount and the negative application amount of the gradient magnetic field 301 become equal, the navigator echo 3021 or 3022 is generated. The navigator echo 3021 or 3022 is collected for a time range 303. When the navigator echo is generated, the phase-encoding gradient magnetic field is not applied, and thus the phase-encoding amount of the navigator echo is 0.

Figure 6:
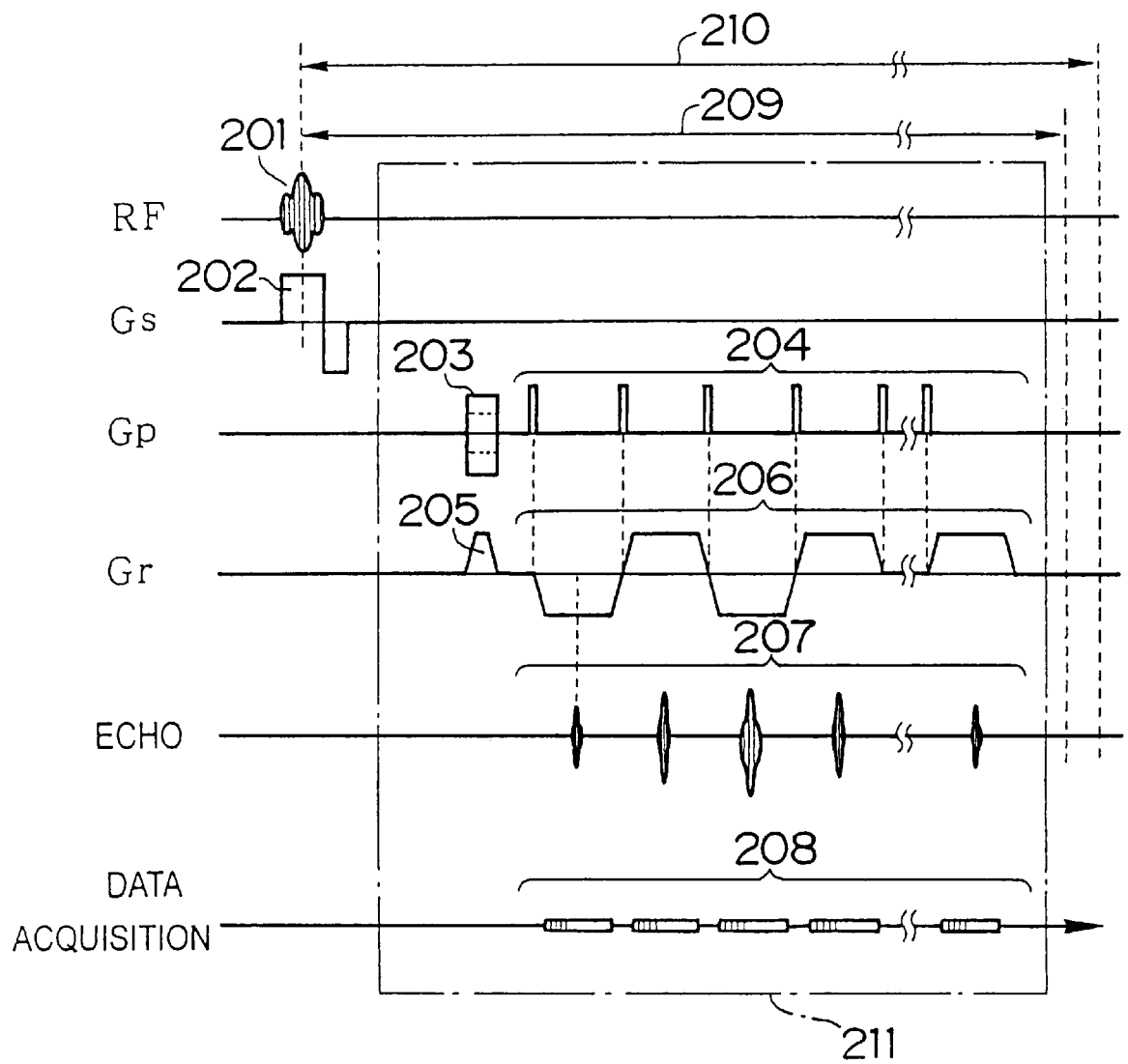
FIG. 6 is a view showing a sequence of multi-shot EPI adopted in the embodiment of the present invention.

Routines 2111 and 2112 in FIG. 2 are equivalent to the routine 211 in FIG. 6, and acquire time series data composed of a plurality of echo signals by the regular EPI sequence. After a pulse 203 for giving an offset for the phase-encoding and a pulse 205 for giving an offset for the readout gradient magnetic field are applied, readout gradient magnetic field pulses 206 of successively alternating polarity are applied. In synchronization with the readout gradient magnetic field pulses 206, phase-encoding gradient magnetic field pulses 204 are discretely applied. Then, each echo signal 207 of each phase-encoding is time-sequentially generated in each cycle of the alternating readout gradient magnetic field pulses 206, and the echo signals 207 are collected for time ranges 208, thereby acquiring time-sequential data.

A segment from the application of the RF pulse 2011 to the routine 2111 is repeated for a repetition time 304 (the time from the application of the RF pulse 2011 to the application of the next RF pulse 2012) while the offset amount of the pulses 203 for giving the offset for the phase-encoding are varied, and image echo signals of all the amounts of the phase-encoding are thereby collected. In this way, for example, the multi-shot EPI is performed where the number of data in the readout direction (KX) is 256, the encoding amount in the phase-encoding direction (KY) is 256, the repetition number of segments (number of segments N) is 64 and the number of the image echo signals collected with one application of the RF pulse (number of echo trains M) is 4.

Each image echo signal thus collected is represented by S(kx, n, m), where kx represents the data number in the readout direction and satisfies $1 \leq kx \leq KX$, n represents an echo collected in the n-th segment and satisfies $1 \leq n \leq N$, and m represents the echo collected m-th in the n-th segment and satisfies $1 \leq m \leq M$. Navigator echoes of equal to N (64 in this embodiment) are acquired. The navigator echoes are generated by the gradient magnetic field in the readout direction (kx direction). Each navigator echo is represented by V(kx, n).

Figure 3:
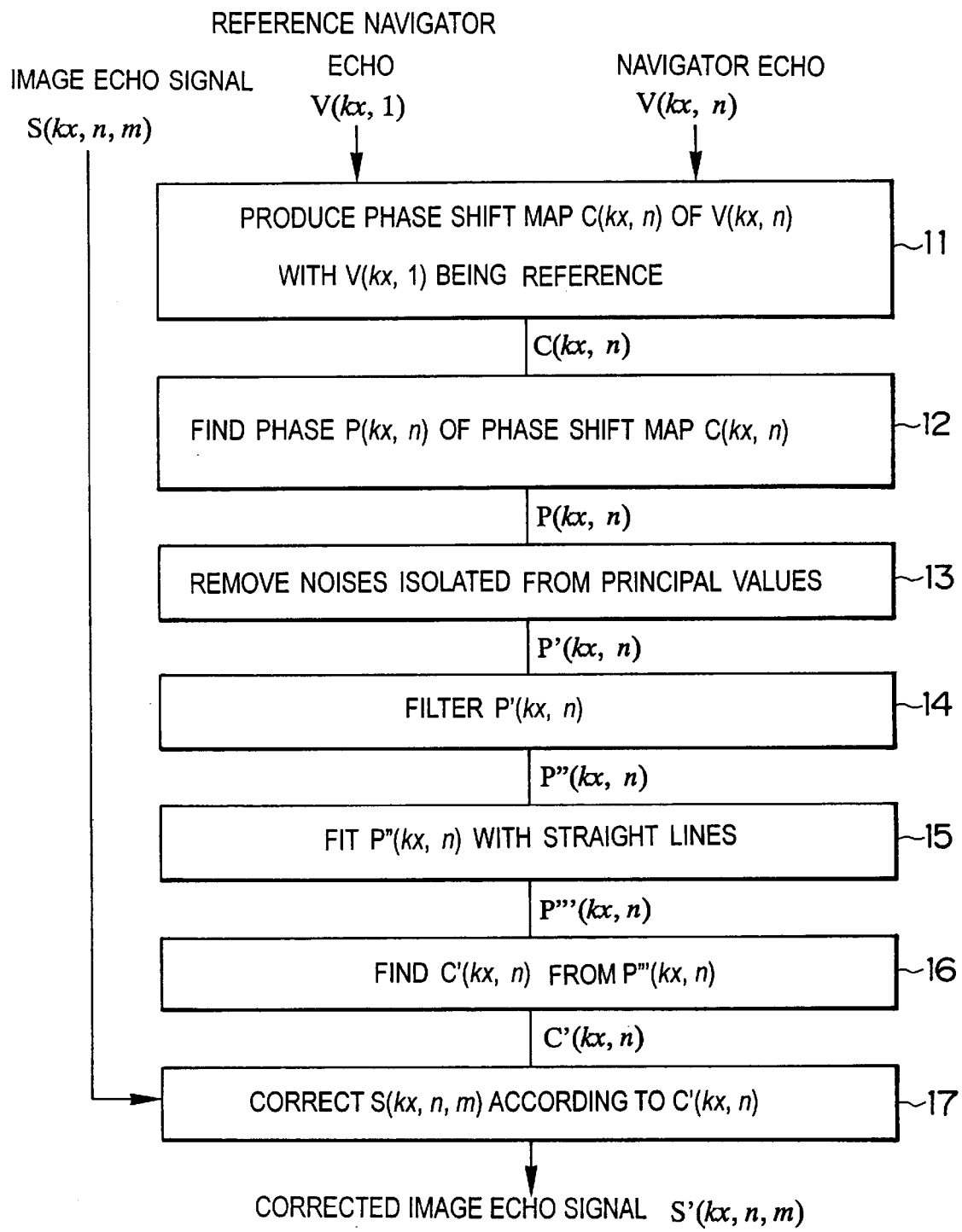
FIG. 3 is a flow chart showing a procedure for correcting a phase shift of an image echo signal in the embodiment of the present invention.
Figure 5A:
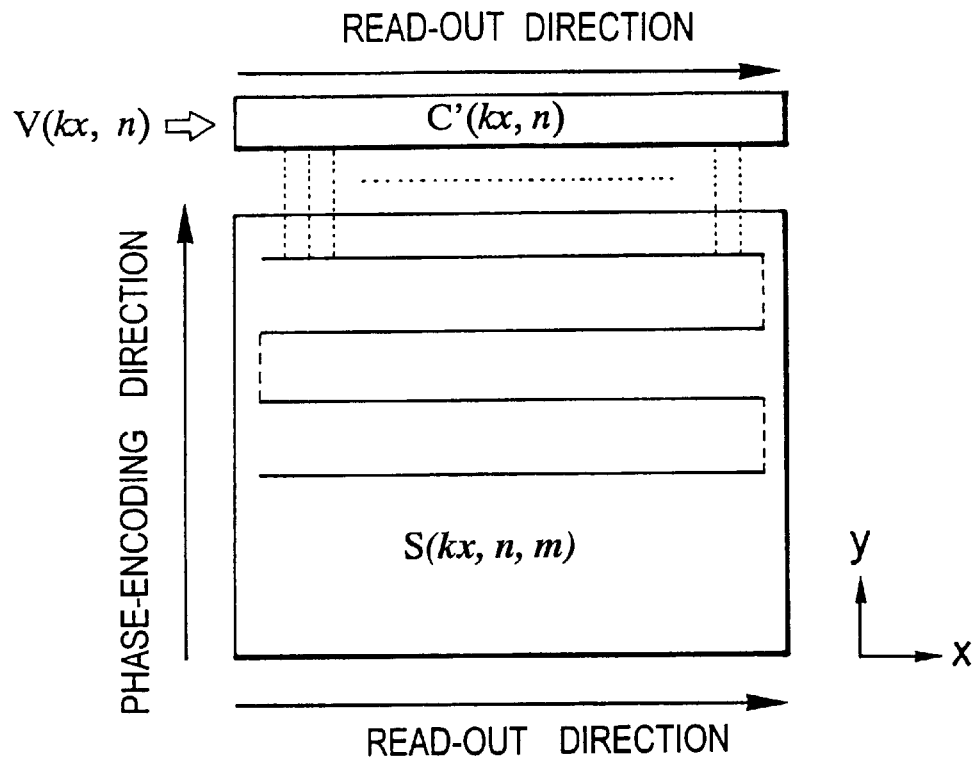
FIGS. 5(a) and 5(b) are views for explaining correction of the image echo signal in the embodiment of the present invention.

The process of correcting the phase shifts of the image echo signals S(kx, n, m) with the navigator echoes V(kx, n) will now be explained with reference to FIGS. 3 and 5(a).

For example, the navigator echo V(kx, 1) collected in the first segment is the reference navigator echo. A phase shift map C(kx, n) defined by the following equations is found with the reference navigator echo V(kx, 1) and the navigator echo V(kx, n) collected in the n-th segment (step 11):

$$Re[C(kx, n)] = Re[V(kx, n)] \times Re[V(kx, 1)]/|V(kx, 1)| + Im[V(kx, n)] \times Im[V(kx, 1)]/|V(kx, 1)|, \text{ and}$$

$$Im[C(kx, n)] = Im[V(kx, n)] \times Re[V(kx, 1)]/|V(kx, 1)| - Re[V(kc, n)] \times Im[V(kx, 1)]/|V(kx, 1)|,$$

where Re[Z] is the real part of Z, Im[Z] is the imaginary part of Z, and |Z| is the absolute value of Z.

Since the phase shift map C(kx, n) includes noises, the phase shift map C(kx, n) is smoothed as follows. First, the phase P(kx, n) of the phase shift map C(kx, n) is found by the following equation (step 12):

$$P(kx, n) = \arctan\left(Im[C(kx, n)]/Re[C(kx, n)]\right).$$

Figure 4D:
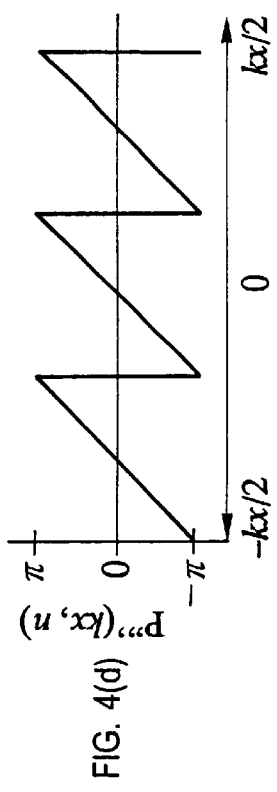
FIGS. 4(a)–4(e) are views showing phases of a phase shift map and correction results found in the embodiment of the present invention.
Figure 4E:
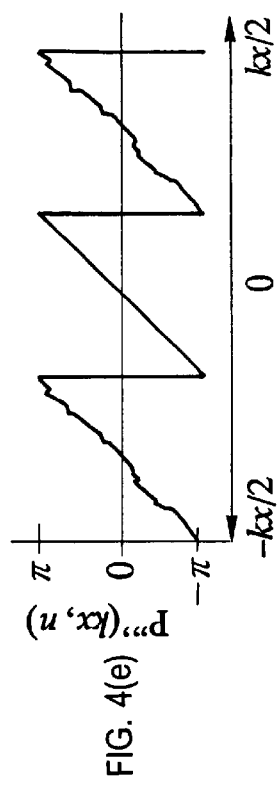
Figure 4A:
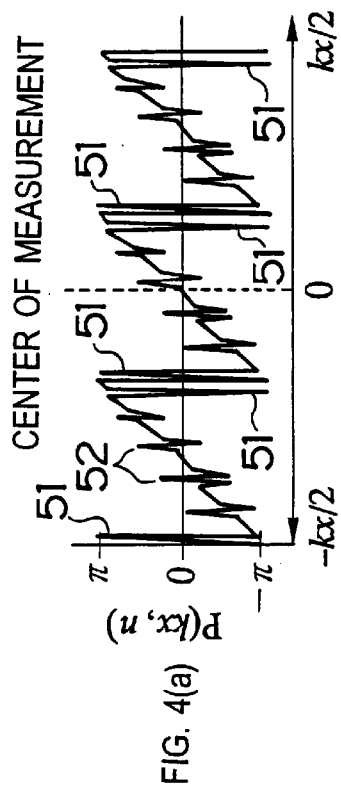

FIG. 4(a) typically shows an example of the phase P(kx, n).

Figure 4B:
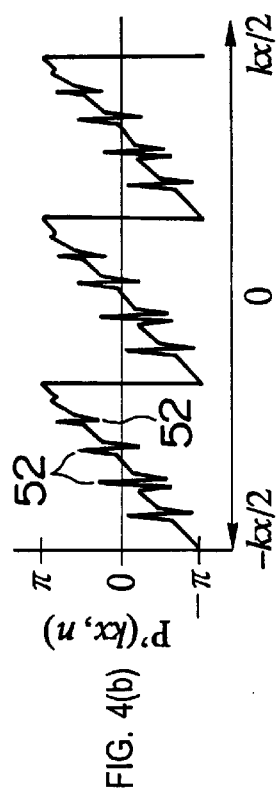

Then, noises 51 isolated from principal values are removed from the phase P(kx, n) by the following process (step 13):

$$If |P(kx, n) - P(kx-1, n)| \geq A \text{ and } |P(kx, n) - P(kx+1, n)| \geq A,$$

then the phase P(kx, n) is replaced by the following equation:

$$P(kx, n)\{P(kx-1, n) + P(kx+1, n)\}/2,$$

where A is a constant of, for example, π~2π. FIG. 4(b) typically shows a phase P'(kx, n) after the noises 51 are thereby removed.

Figure 4C:
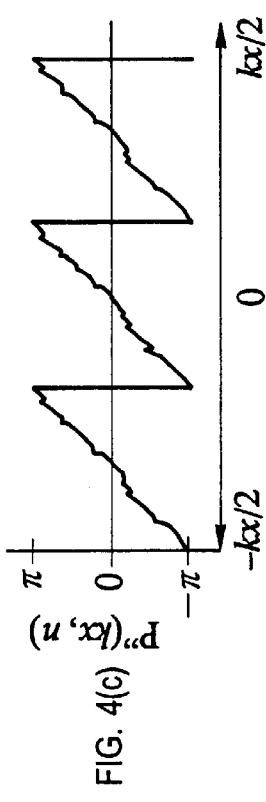

Next, noises 52 are removed from the phase P'(kx, n) with, for example, a median filter (step 14). The window of the median filter is, for example, 5. FIG. 4(c) typically shows a phase P"(kx, n) after the noises 52 are removed. The noises 52 may be removed with a Butterworth filter, and the local averaging processing may be performed.

Thereafter, the phase P"(kx, n) is approximated to straight lines with, for example, a linear function y=ax+b (a, b are constants) (step 15). FIG. 4(d) typically shows a phase P'"(kx, n) after this processing. FIG. 4(d) shows an example where the phase P"(kx, n) is approximated to the straight lines P'"(kx, n) over all the time phases (−kx~+k), but only middle part, which has a large contribution to the contrast of the reconstructed image, may be approximated as shown in FIG. 4(e).

From the phase P'"(kx, n) thus obtained, a smoothed phase shift map C'(kx, n) is found by the following equations (step 16):

$$Re[C'(kx, n)] = \cos P'''(kx, n), \text{ and}$$

$$Im[C'(kx, n)] = \sin P'''(kx, n).$$

With the phase shift map C'(kx, n) thus smoothed, the phase shift of the image echo signal S'(kx, n, m) is corrected to acquire a corrected image echo signal S'(kx, n, m) (step 17). With respect to the image echo signal S(kx, n, m) of the same segment and the same time phase (i.e., kx and n are respectively the same) as the phase shift map C'(kx, n), the phase shift of the image echo signal S(kx, n, m) is corrected by the following equations as shown in FIG. 5(a):

$$Re[S'(kx, n, m)] = Re[S(kx, n, m)] \times Re[C'(kx, n)]/|C'(kx, n)| + Im[S(kx, n, m)] \times Im[C'(kx, n)]/|C'(kx, n)|,$$

and $$Im[S'(kx, n, m)] = Im[S(kx, n, m)] \times Re[C'(kx, n)]/|C'(kx, n)| - Re[S(kx, n, m)] \times Im[C'(kx, n)]/|C'(kx, n)|.$$

An image is reconstructed with the corrected image echo signal S'(kx, n, m). Thus, even if the patient moves more than some pixels in the readout direction between the segments in the pulse sequence in FIG. 2, the phase shifts of the image echoes caused by the motion can be corrected, and the image without any artifact can be acquired as a result.

In this embodiment, the navigator echo collected in the first segment is the reference navigator echo, but a navigator echo collected in any segment may be the reference navigator echo. Also, in the pulse sequence in FIG. 2, one navigator echo is generated each time the segment is repeated, but a plurality of navigator echoes may be generated each time the segment is repeated and a phase shift map may be produced according to data that is acquired by adding the navigator echoes.

In this embodiment, the navigator echoes are generated by the gradient magnetic field in the readout direction, and the phase shifts of the image echo signals caused by the patient motion in the readout direction are corrected with the navigator echoes; however, the direction of the gradient magnetic field for generating the navigator echoes is not limited to this. For example, navigator echoes may be generated by the phase-encoding gradient magnetic field when 2D-imaging is performed, or navigator echoes may be generated by the slice-encoding gradient magnetic field when 3D-imaging is performed, and the navigator echoes may be used. Thus, the phase shifts of the image echo signals that are caused by the patient motion in the same direction as the gradient magnetic field for generating the navigator echoes can be corrected. Moreover, a plurality of navigator echoes may be generated between the application of the RF pulse and the routine 2111 in FIG. 2 by gradient magnetic fields in a plurality of directions.

For example, when the phase-encoding gradient magnetic field generates navigator echoes V(ky, n), a phase shift map C(ky, n), which is a function of a phase-encoding amount ky, is acquired. See FIG. 5(b). Then, as shown in FIG. 5(b), with the shift map C(ky, n) found from the navigator echo collected in the n-th segment, an image echo signal S(kx, ky, n) collected in the same segment is corrected on a ky-by-ky basis.

Figure 5B:
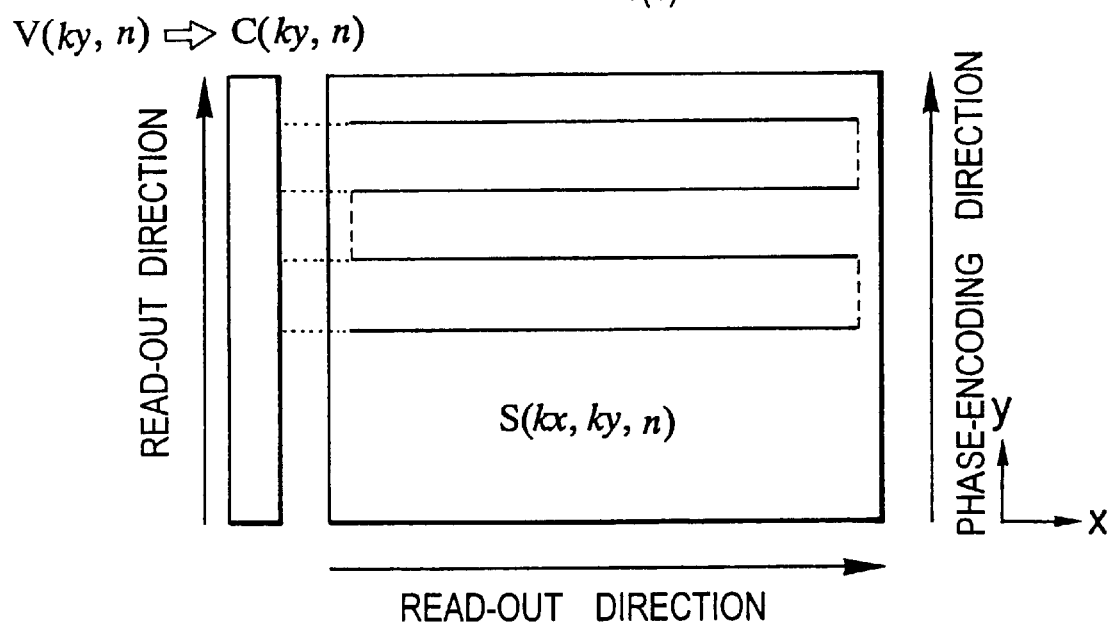

In this case, although the ky axis of the navigator echoes and the ky axis of the image echoes coincide with each other in FIG. 5(b), they do not necessarily coincide with each other. Each point $ky_n$ of the navigator echo and each point $ky_m$ of the image echo satisfy the following equation:

$$ky_n/ky_m = (Gy_m \times \tau)/(Gy_n \times \Delta t) (\equiv \alpha),$$

where $Gy_n$ is the intensity of the phase-encoding gradient magnetic field for generating the navigator echo, t is the time for which this gradient magnetic field is applied, Δt is the interval between the data, $Gy_m$ is the intensity of the phase-encoding gradient magnetic field for generating the image echo, and τ is the time for which this gradient magnetic field is applied.

Therefore, the ky axis of the navigator echo has an interval of α times of that of the ky axis of the image echo. If α=1, the points $ky_n$ of the navigator echo and points $ky_m$ of the image echo correspond one-to-one as shown in FIG. 5(b). On the other hand, if α≠1, deficient data is interpolated and the correction is then performed.

By thus correcting the phase shifts of the image echo signals in the phase-encoding direction, the artifacts caused by the patient motion in the phase-encoding direction can be removed. Likewise, in the slice direction, the artifacts can be removed in the method according to the present invention.

Moreover, the present invention is not limited to those disclosed in the above embodiment and explanation and it may take a variety of forms on the basis of the effect of the present invention. For example, the imaging sequence to which the present invention is applied is not limited to the multi-shot EPI, and it may be any sequence in which the data required for the reconstruction of one image is acquired by repeating a plurality of times the segment comprising the applications of the RF pulse and the gradient magnetic fields and the data acquisition. The present invention may be applied to, for example, the multishot BURST sequence, the hybrid BURST sequence, the gradient echo sequence, the echo volumer, the spiral imaging, the EPI spectroscopic imaging and so on.

Industrial Applicability

As set forth hereinabove, according to the MR imaging method and apparatus of the present invention, in the MR imaging method where the data required for the reconstruction of one image is acquired by repeating a plurality of times the segment comprising the applications of the RF pulse and the gradient magnetic fields and the data acquisition, the phase shifts of the image echo signals caused by the patient motion can be corrected to remove the motion artifacts. Since the correction is performed in realtime, the MR imaging method and apparatus of the present invention are also effective for the IVR.

What is claimed is:

1. A nuclear magnetic resonance imaging method for acquiring image data required for reconstruction of an image by repeating a plurality of times a segment in which an RF pulse and gradient magnetic fields in three directions that are perpendicular to each other are applied to a subject to time-sequentially generate and collect image echo signals, the nuclear magnetic resonance imaging method comprising:
   (a) generating and collecting at least one navigator echo in each of the plurality of segments;
   (b) producing in k-space a phase shift map of each navigator echo collected in each of the plurality of segments with the navigator echo collected in a certain segment among the plurality of segments being a reference; and
   (c) modifying in k-space a phase of the image echo signals collected in each of the plurality of segments according to each phase shift map of each navigator echo collected in each of the plurality of segments.

2. A nuclear magnetic resonance imaging method for acquiring image data required for reconstruction of an image by repeating a plurality of times a segment in which an RF pulse and gradient magnetic fields in three directions that are perpendicular to each other are applied to a subject to time-sequentially generate and collect image echo signals, the nuclear magnetic resonance imaging method comprising:
   (a) applying a gradient magnetic field pulse in α-direction that is one of the three directions to generate and collect a navigator echo in each of the plurality of segments;
   (b) producing, in k-space as a function in the α-direction, a phase shift map of each navigator echo collected in each of the plurality of segments with the navigator echo collected in a certain segment among the plurality of segments being a reference;
   (c) modifying in k-space a phase at each time phase of the image echo signals collected in each of the plurality of segments according to each phase shift map of each navigator echo collected in each of the plurality of segments; and
   (d) reconstructing the image from the modified image echo signals.

3. The nuclear magnetic resonance imaging method as defined in claim 2, wherein the three directions are a slicing direction, a phase-encoding direction and a readout direction, respectively, and the α-direction is the readout direction.

4. A nuclear magnetic resonance imaging method, comprising:
   (a) applying a gradient magnetic field in a slicing direction to a subject to select a slice substantially at the same time as applying an RF pulse;
   (b) applying a gradient magnetic field pulse in α-direction that is one of the slicing direction, a phase-encoding direction and a readout direction to generate and collect a navigator echo;
   (c) applying a phase-encoding gradient magnetic field pulse which gives an offset for a phase-encoding and a readout gradient magnetic field pulse which gives an offset in the readout direction;
   (d) applying readout gradient magnetic field pulses of successively alternating polarity and applying phase-encoding gradient magnetic field pulses in synchronization with the readout gradient magnetic field pulses to time-sequentially generate and collect image echo signals within each cycle of the alternating readout gradient magnetic field pulses;
   (e) repeating a plurality of times a segment comprising the steps of (a)–(d);
   (f) producing, in k-space as a function in the α-direction, a phase shift map of each navigator echo collected in each of the plurality of segments with the navigator echo collected in a certain segment among the plurality of segments being a reference;
   (g) modifying in k-space a phase at each time phase of the image echo signals collected in each of the plurality of segments according to each phase shift map of each navigator echo collected in each of the plurality of segments; and
   (h) reconstructing an image from the modified image echo signals.

5. The nuclear magnetic resonance imaging method as defined in claim 4, wherein the α-direction is the readout direction.

6. The nuclear magnetic resonance imaging method as defined in claim 4, wherein a phase of each phase shift map is fitted with a function in the step (f).

7. The nuclear magnetic resonance imaging method as defined in claim 4, wherein a phase of each phase shift map is filtered in the step (f).

8. The nuclear magnetic resonance imaging method as defined in claim 7, wherein the phase of each phase shift map is fitted with a function in the step (f).

9. A nuclear magnetic resonance imaging apparatus, comprising:
   uniform magnetic field generating means for generating a uniform magnetic field to a space where a subject is placed;
   gradient magnetic field generating means for applying gradient magnetic fields in three directions that are perpendicular to each other to the subject;
   radio-frequency magnetic field generating means for applying an RF pulse to the subject;
   signal detecting means for detecting echo signals generated from the subject; and
   controlling means for:
      acquiring image data required for reconstruction of an image by repeating a plurality of times a segment in which the RF pulse and the gradient magnetic fields in the three directions are applied to the subject by the radio-frequency magnetic field generating means and the gradient magnetic field generating means to time-sequentially generate image echo signals from the subject and the image echo signals are collected by the signal detecting means;

generating at least one navigator echo by applying a gradient magnetic field pulse to the subject by the gradient magnetic field generating means and collecting the at least one navigator echo by the signal detecting means in each of the plurality of segments;

producing in k-space a phase shift map of each navigator echo collected in each of the plurality of segments with the navigator echo collected in a certain segment among the plurality of segments being a reference; and modifying in k-space a phase of the image echo signals collected in each of the plurality of segments according to each phase shift map of each navigator echo collected in each of the plurality of segments.

10. A nuclear magnetic resonance imaging apparatus, comprising:

uniform magnetic field generating means for generating a uniform magnetic field to a space where a subject is placed;

gradient magnetic field generating means for applying gradient magnetic fields in three directions that are perpendicular to each other to the subject;

radio-frequency magnetic field generating means for applying an RF pulse to the subject;

signal detecting means for detecting echo signals generated from the subject;

controlling means for:
  acquiring image data required for reconstruction of an image by repeating a plurality of times a segment in which the RF pulse and the gradient magnetic fields in the three directions are applied to the subject by the radio-frequency magnetic field generating means and the gradient magnetic field generating means to time-sequentially generate image echo signals from the subject and the image echo signals are collected by the signal detecting means;

generating a navigator echo by applying a gradient magnetic field pulse in α-direction that is one of the three directions to the subject by the gradient magnetic field generating means and collecting the navigator echo by the signal detecting means in each of the plurality of segments;

producing, in k-space as a function in the α-direction, a phase shift map of each navigator echo collected in each of the plurality of segments with the navigator echo collected in a certain segment among the plurality of segments being a reference; and modifying in k-space a phase at each time phase of the image echo signals collected in each of the plurality of segments according to each phase shift map of each navigator echo collected in each of the plurality of segments;

signal processing means for reconstructing the image from the modified image echo signals; and displaying means for displaying the reconstructed image.

11. A nuclear magnetic resonance imaging apparatus, comprising:

uniform magnetic field generating means for generating a uniform magnetic field to a space where a subject is placed;

gradient magnetic field generating means for applying gradient magnetic fields in three directions that are perpendicular to each other to the subject;

radio-frequency magnetic field generating means for applying an RF pulse to the subject;

signal detecting means for detecting echo signals generated from the subject;

controlling means for:
  acquiring image data required for reconstruction of an image by repeating a plurality of times a segment in which the RF pulse and the gradient magnetic fields in the three directions are applied to the subject by the radio-frequency magnetic field generating means and the gradient magnetic field generating means to time-sequentially generate image echo signals from the subject and the image echo signals are collected by the signal detecting means:

generating a navigator echo by applying a gradient magnetic field pulse to the subject by the gradient magnetic field generating means and collecting the navigator echo by the signal detecting means in each of the plurality of segments;

finding phase differences between the navigator echo that is collected in a certain segment among the plurality of segments and others of the navigator echoes; and modifying phases of the image echo signals according to the phase differences;

signal processing means for reconstructing the image from the modified image echo signals; and displaying means for displaying the reconstructed image.

12. A magnetic resonance imaging apparatus, comprising:

uniform magnetic field generating means for generating a uniform magnetic field to a space where a subject is placed;

gradient magnetic field generating means for applying gradient magnetic fields in three directions that are perpendicular to each other to the subject;

radio-frequency magnetic field generating means for applying an RF pulse to the subject;

signal detecting means for detecting echo signals generated from the subject; and controlling means for performing gradient magnetic field generating, radio-frequency magnetic field generating and signal detecting in a predetermined sequence and performing image reconstruction calculation with the detected echo signals, wherein the controlling means performs a sequence in which the echo signals are acquired for a predetermined repetition time and the acquisition of the echo signals is repeated to acquire image data signals of at least one slice and a navigation echo is generated for each repetition time, finds phase differences between one of the navigation echoes that is a reference and others of the navigation echoes, and modifies in k-space phases of the image echo signals according to the phase differences.

13. The magnetic resonance imaging apparatus as defined in claim 12, wherein the controlling means comprises phase difference modifying means for modifying the phase differences.

14. A magnetic resonance imaging apparatus, comprising:

a magnet which generates a static magnetic field to a space where a subject is placed;

gradient magnetic field coils which apply gradient magnetic fields in a slicing direction, a phase-encoding direction and a readout-encoding direction, respectively, to the space;

an RF coil which generates radio-frequency pulses to excite nuclei in a subject part of the subject;

an RF probe which receives magnetic resonance signals from the subject;

a controlling part which performs gradient magnetic field application and radio-frequency pulse application in a predetermined sequence;

a signal processing part which performs signal processing such as image reconstruction from the received magnetic resonance signals; and a displaying part which displays image signals from the signal processing;

wherein the signal processing part finds phase difference information between one of the navigation echoes in each segment that is a reference and others of the navigation echoes, and modifies in k-space phases of the image echo signals according to the phase difference information.

15. The magnetic resonance imaging apparatus as defined in claim 14, wherein the signal processing part removes noise components from the phase difference information and smoothes the phase difference information.

16. A nuclear magnetic resonance imaging method for acquiring image data required for reconstruction of an image by repeating a plurality of times a segment in which an RF pulse and gradient magnetic fields in three directions that are perpendicular to each other are applied to a subject to time-sequentially generate and collect image echo signals, the nuclear magnetic resonance imaging method comprising:

generating and collecting at least one navigator echo in each of the plurality of segments;

finding phase differences between the navigator echo that is collected in a certain segment among the plurality of segments and others of the navigator echoes; and modifying phases of the image echo signals according to the phase differences.

17. A nuclear magnetic resonance imaging apparatus, comprising:

uniform magnetic field generating means for generating a uniform magnetic field to a space where a subject is placed;

gradient magnetic field generating means for applying gradient magnetic fields in three directions that are perpendicular to each other to the subject;

radio-frequency magnetic field generating means for applying an RF pulse to the subject;

signal detecting means for detecting echo signals generated from the subject; and controlling means for:

acquiring image data required for reconstruction of an image by repeating a plurality of time a segment in which the RF pulse and the gradient magnetic fields in the three directions are applied to the subject by the radio-frequency magnetic field generating means and the gradient magnetic field generating means to time-sequentially generate image echo signals from the subject and the image echo signals are collected by the signal detecting means, generating a navigator echo by applying a gradient magnetic field pulse to the subject by the gradient magnetic field generating means and collecting the navigator echo by the signal detecting means in each of the plurality of segments, finding phase differences between the navigator echo that is collected in a certain segment among the plurality of segments and others of the navigator echoes; and modifying phases of the image echo signals according to the phase differences.

* * * * *